(12) United States Patent
Wesneski et al.

(10) Patent No.: US 10,404,244 B2
(45) Date of Patent: Sep. 3, 2019

(54) ADJUSTMENTS OF OUTPUT CLOCKS

(71) Applicant: Hewlett Packard Enterprise Development LP, Houston, TX (US)

(72) Inventors: Christopher Wesneski, Plano, TX (US); Theodore F. Emerson, Houston, TX (US); Kenneth T. Chin, Houston, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 341 days.

(21) Appl. No.: 15/475,243

(22) Filed: Mar. 31, 2017

(65) Prior Publication Data

US 2018/0287621 A1    Oct. 4, 2018

(51) Int. Cl.
  *H03K 5/135*  (2006.01)
  *H03L 7/197*  (2006.01)

(52) U.S. Cl.
  CPC ........... *H03K 5/135* (2013.01); *H03L 7/1976* (2013.01)

(58) Field of Classification Search
  CPC .............................. H03K 5/135; H03L 7/1976
  See application file for complete search history.

(56) References Cited

U.S. PATENT DOCUMENTS

| 6,342,799 | B1 | 1/2002 | Nilson |
| 7,397,312 | B2 | 7/2008 | Gulford |
| 7,782,988 | B2 | 8/2010 | Ziesler |
| 7,934,115 | B2 | 4/2011 | Ferraiolo et al. |
| 2006/0245532 | A1* | 11/2006 | Ziesler ..................... H03L 7/16 375/376 |
| 2016/0164531 | A1 | 6/2016 | Dionne et al. |

FOREIGN PATENT DOCUMENTS

JP    H08273302    10/1996

OTHER PUBLICATIONS

Staszewski R. et al., "All-Digital Frequency Synthesizer in Deep-Submicron CMOS", Wiley-Interscience A John Wiley & Sons, Inc., 2006, 29 Pgs.

* cited by examiner

*Primary Examiner* — Jeffrey M Shin
(74) *Attorney, Agent, or Firm* — Hewlett Packard Enterprise Patent Department

(57) ABSTRACT

An example device in accordance with an aspect of the present disclosure includes a first stage and an accumulator. The first stage is based on digital logic and integer arithmetic to scale a reference clock by a configurable ratio of integers according to a line drawing technique to obtain an output clock. The accumulator is to store an accumulated error of a variable used in the line drawing technique.

15 Claims, 6 Drawing Sheets

ADJUSTMENTS OF OUTPUT CLOCKS

BACKGROUND

A device can use a local clock to synchronize information that is exchanged with another device. For example, a device can provide a receive clock for receiving display information from an active display source. To receive an incoming video waveform correctly, the receive clock should be accurate over the course of an entire video frame. Additionally, for video waveforms such as those used in the DisplayPort digital display interface, clock recovery with active clock drift adjustment is to be performed by the receiver, to account for any difference in clock frequency between the transmitter and receiver.

BRIEF DESCRIPTION OF THE DRAWINGS/FIGURES

DETAILED DESCRIPTION

Figure 1:
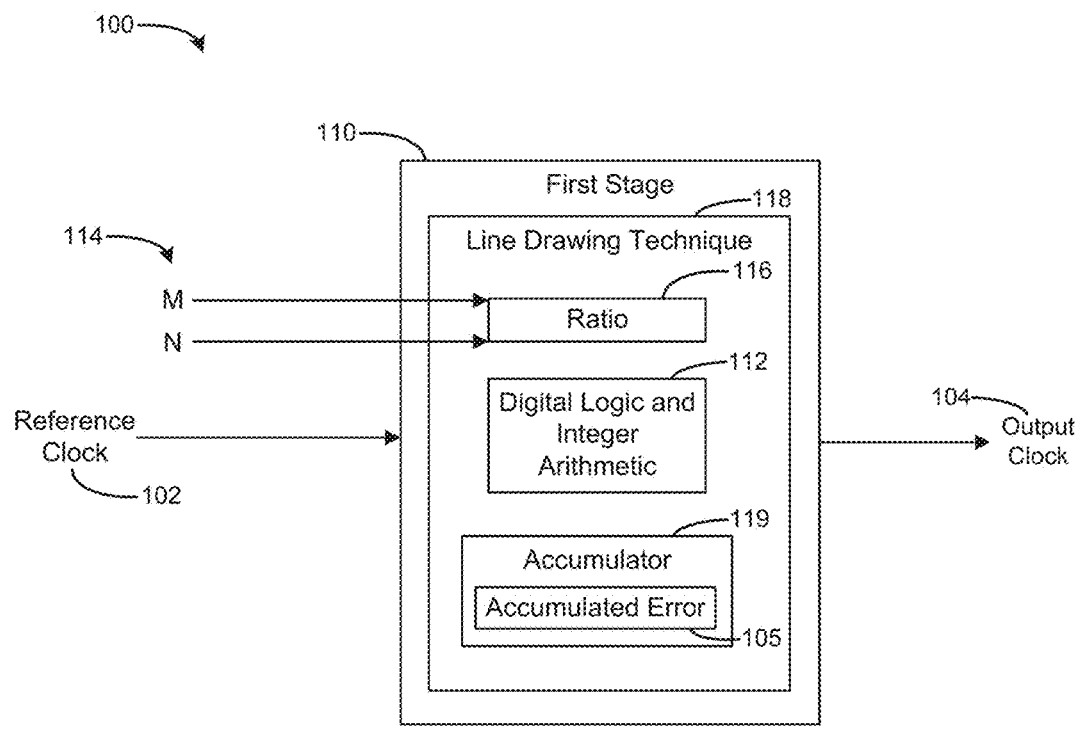
FIG. 1 is a block diagram of a device including a first stage and an accumulator according to an example.

A device can use a pixel clock to drive a display. However, even when a source device is not driving a display, a running pixel clock may still be needed. For example, a management chip may span multiple host instances, each running their own operating system with their own video device and device driver, but may only display one video waveform at a time between the multiple host instances. The video device(s) not being displayed at a given time may still need an active pixel clock to avoid device driver issues/failures or even operating system failures. It is also possible that the output of the video device not being displayed is being redirected to a remote device over the network. Because the two hosts operate independently, each may be configured for a different screen resolution. Accordingly, the pixel clock frequency of the video controller not being displayed may not be the same frequency as the active video source driving the common display output. Thus, replication of pixel clock generators is needed for each video source.

Although a clock can be provided based on replication of multiple analog Phase Locked Loop (PLL) circuits with programmable analog interpolators, such circuits typically consume a large amount of die area, need special consideration during floor-planning, power plane design, package selection, and package design, and such solutions do not scale well with the number of display sources. Furthermore, although simple, fixed power-of-two (or more complex power-of-N) dividers need less die area and do not require the special consideration needed with analog components, such dividers lack the flexibility to scale the frequency over a wide range and do not provide drift compensation.

To overcome such issues, examples described herein can provide a highly portable area-efficient design to approximate the output of a variable frequency oscillator, based on digital logic and integer arithmetic. Example implementations can use digital logic and integer arithmetic to produce the scalable digital waveforms with programmable drift compensation without a need for costly analog counterparts (e.g., PLLs), to approximate the accuracy of an ideal clock, such as that used as a video clock. Generally, if a video device is not presently driving an analog output (such as analog video graphics array (VGA), National Television System Committee (NTSC), phase alternating line (PAL), or the like), then the jitter accuracy may be relaxed and does not need to be clock-for-clock accurate. In another use case, digital display devices typically consume buffered data and may not require low-jitter clocks. Accordingly, the need for a complex clock generator is more flexible. This allows for area-efficient designs and better scalability. Example implementations for various use cases include e.g., Baseboard Management Controllers (BMCs), Keyboard, Video, and Mouse (KVM) redirection, that can involve redirecting multiple video sources to a common analog display output. Additionally, example implementations can be used for consuming output from a video controller, e.g., DisplayPort, by generating an approximate clock to decode the incoming output and adjusting the approximate clock using drift compensation. Such usage scenarios involve applications that can tolerate a high-jitter clock, and the example implementations can remain accurate over time (e.g., based on drift compensation and/or digital logic).

Some example digital waveform generators described herein can use a fixed reference clock, Fref-sys, and provide frequency scaling based on a configurable ratio of integers, M/N, to achieve a wide range of adjustable ratios without the need for hardware multipliers or dividers, while providing drift compensation. Thus, some example implementations provide alternative solutions to replicating costly analog clock generation circuits for display outputs. By using integer-only arithmetic and digital-only logic, some example implementations produce an area efficient, low-power design that can scale an input clock linearly over a wide range of ratios in order to approximate the waveform of the analog circuit. Example functionality can be described in a Hardware Description Language (HDL) and can be written once at the Register Transfer Level (RTL), and can be reused in many different silicon technologies using common synthesis tools readily mapped to different silicon technologies, processes, and devices.

FIG. 1 is a block diagram of a device 100 including a first stage 110 and an accumulator 119 according to an example. The first stage 110 is based on digital logic and integer arithmetic 112 to scale a reference clock 102 by a configurable ratio 116 of integers 114 according to a line drawing technique 118 to obtain an output clock 104. The accumulator 119 is to store an accumulated error 105 of a variable used in the line drawing technique 118, to adjust the output clock 104.

The device 100 can be used for processing a signal (not shown) based on the output clock 104, such as a video signal from another device. The output clock 104 can be adjusted as needed. For example, adjusted to accommodate differences between two separate components each with their own clocks, especially from different manufacturers using different parts or tolerances that can cause the clocks to drift with respect to each other over time. In digital video, a source device can transmit a clock and data signal, where a clock to be recovered is embedded in the data stream.

Baseboard Management Controllers (BMCs), Keyboard/Video/Mouse (KVM) redirection, and other devices which consume a digital video waveform can use an approximate, high-jitter clock (such as the output clock 104 which can involve jitter while maintaining approximate accuracy over time), running at a frequency (e.g., as adjusted by ratio 116) which achieves the correct pixel refresh rate. When receiving a digital video waveform where extreme accuracy is needed, such as receiving a DisplayPort waveform, the clock frequency can be adjusted by the device 100 in real-time to account for drift between the transmitter and receiver. Because the device 100 is implemented using digital logic and integer arithmetic 112 (see example implementation in FIG. 3), there is no need for cumbersome standard analog Phase-Locked Loop (PLL) circuits and/or programmable interpolators, which would be area intensive and need special consideration during design and manufacturing for each silicon process node. In contrast, the device 100 can be implemented using digital logic and integer arithmetic implemented with synthesis tools that can readily be mapped to different silicon process nodes.

In contrast to other approaches that attempt to recreate an entire representation of an input waveform, some example implementations of device 100 can use drift compensation (see FIG. 2) to speed up and slow down the output clock 104 as needed, by adjusting accumulator 119. Thus, the device 100 can be realized in a smaller physical footprint compared to more cumbersome approaches. The device 100 can perform a digital-to-digital conversion, without need to correct an analog source.

The reference clock 102 (which can be a greatly multiplied version of Fref-sys) can be provided as a fixed-frequency clock. The device 100 can scale the reference clock 102 by an integer ratio 116, which is a configurable ratio 116 of integers 114 expressable in terms of a multiplier (M) and a divider (N) as M/N. The ratio 116 is thus expressable at a finer granularity than a binary representation, because of the many possible ratios available (in contrast to fixed powers of two in a binary representation, or even fixed powers of N in an N-ary representation). In some alternate example implementations, the first stage 110 can apply a scaling constant C (not shown in FIG. 1, see equations shown in FIG. 2) to configure the configurable ratio 116 of integers 114 M/N. Example implementations can perform multiplication using the ratio M/N. More specifically, a PLL can be used to multiply a reference clock (e.g., Fref-sys) to a high frequency (e.g., 32x) internal clock that is shared by example implementations in a given system, which can serve as a "virtual" PLL by providing a digital approach of calculating an approximate waveform. The high frequency up-scaled common source can then be divided down. A high speed internal clock (which can be, e.g., greater than or equal to double the maximum desired output clock) can be used, which can be chosen as a multiple of a reference clock and may be shared as the main internal clock inside the given system, which may be, e.g., a system on chip (SOC). Thus, the ratio 116 provides great flexibility in scaling a desirable output clock 104.

The device 100 also can use a line drawing technique 118 to apply linear scaling to the clock according to the ratio 116. In an example implementation, the device 100 uses the digital logic and integer arithmetic 112 to scale the reference clock 102 according to Bresenham's line drawing technique as the line drawing technique 118. The line drawing technique 118 does not need to extend into all eight octants of the Euclidean three-dimensional coordinate system (or into all four quadrants of a two-dimensional coordinate system), and may be defined for negative slopes whose absolute value is less than one. The integers 114 M and N are used as the slope of the line in the line drawing technique 118, and the line drawing technique 118 is used to track the accumulated error 105 used for generation of the output clock 104.

The device 100 makes use of the accumulator 119 to accumulate an error (accumulated error 105) for use in adjusting the output clock 104. Accordingly, the device 100 enjoys the benefit of allowing for lower resource utilization for accumulating a relatively small difference in the accumulator 119, avoiding, according to the line drawing technique 118, a need to store the entire history. Use of the line drawing technique 118 allows the use of constants to maintain an approximation of a ratio of values, using the accumulator 119. For example, the line drawing technique 118 can operate using merely the changes, or deltas, in X and Y line coordinate information, in contrast to needing to store the absolute values of such coordinate information. Accordingly, example implementations can avoid a need for maintaining actual X and Y values, which would become relatively large and cumbersome with associated need for higher capacity storage and adder/subtractor components.

The first stage 110 can use the accumulator 119 to generate a pulse of the output clock 104, in response to an overflow of the accumulator 119. For example, to generate the output clock 104, when the accumulator 119 overflows, the device 100 generates a pulse. A frequency of that pulse can represent the frequency (e.g., Fout) of the output clock 104. This manner of generating the output clock 104 based on accumulator overflow is in contrast to other approaches, e.g., accumulating phase. Rather, some example implementations of the device 100 can accumulate errors in the slope of the line used in the line drawing technique 118, thereby applying accumulated error 105 and thereby refining the slope of the line to generate the output clock 104.

The device 100 has many applications, and can be implemented in high-speed serial interfaces such as Peripheral Component Interconnect Express (PCIe), Intel® QuickPath Interconnect (QPI), DisplayPort, and other approaches that can embed a clock in the data stream, the clock being recovered by the receiver (e.g., based on Clock Data Recovery (CDR)). In an example, CDR can be used in Serializer/Deserializer (SERDES) to recover a source link clock, which can be used to establish a common link clock between the source and destination SERDES. Example implementations described herein can be used to recover information inside the data transported over the now-synchronized SERDES. For example, DisplayPort places pixel data, from a source video clock, as data inside SERDES packets, and provides an M and N value of that clock as data inside the stream. The M and N values are used by example implementations to approximate the target frequency. It is then possible to measure how many pixels worth of data stream in over the link. By knowing how many arrive over time, it is possible to compare to the output clock 104 and generate, e.g., a disposal clock, usable to "remove" (e.g., delay) pulses of the clock from a first in, first out (FIFO) buffer, which can result in drifting with respect to each other. That is, example implementations can receive more or fewer pixels over time than the output clock 104 is able to clock out. This can accumulate as error, between the amount of pixels received and the amount of pixels processed, which can be fed to, e.g., the second stage 220 shown in FIG. 2. Some applications, such as KVM usage scenarios, may approximate a "placebo" or "virtual" clock that can tolerate a high-jitter clock as long as it is reasonably accurate over time. Other applications can find short-term jitter acceptable, so long as the number of clock edges/pulses over time is preserved. The device 100 has flexibility to approximate the frequency over time, without needing to be perfect over a short sample period (so long as, in some usage scenarios, extended time does not result in pixel artifacts on the screen). Some applications have tighter tolerances on what ranges of the output clock 104 can be tolerated. In digital video, the tolerances for output clock 104 are relatively more relaxed, such that an approximation of the output clock 104 can be used to handle, in concert with error correction, drift compensation between the source crystal/clock and the receive crystal/clock. The device 100 also can be used to receive output from a video source/chip, and then capture and/or redirect the output to a management application (e.g., taking a live video waveform from a processor and redirecting it via a management device providing KVM over Internet Protocol (IP)).

Accordingly, use of the device 100 enables the avoidance of expensive circuitry such as PLLs that need silicon area, external capacitors, analog power supplies and ground, and so on. By serving as a "virtual" PLL, the device 100 provides a digital approach of calculating an approximate waveform. Such an approximation can satisfy the needs of various situations/usage scenarios, such as where multiple video cores are used (where one is actually displayed at a time) but non-displayed cores can be satisfied with relaxed accuracy. Additionally, the device 100 can be used in the clocking of a DisplayPort Sink device. When consuming the DisplayPort waveform, it is useful to have a clock accurate over time that matches the source frequency and that does not drift beyond the capabilities of receiver components to compensate. A virtual PLL provided by the device 100 can be used to clock the DisplayPort receiver to match the source frequency.

Thus, example implementations described herein can produce a scalable digital waveform as the output clock 104, having programmable drift compensation (e.g., based on direction and/or accumulation input, such as from a second stage). Accordingly, the device 100 can produce output clock 104 and can be used in place of costly analog counterparts to approximate the accuracy of the receive clock. Using digital logic and integer arithmetic 112 enables an area efficient design allowing better scalability for multiple display sources integrated on a single device. The design of device 100 can be described in Hardware Description Language and mapped to many different silicon processes for Application-Specific Integrated Circuits (ASICs), Field-Programmable Gate Arrays (FPGAs), or other suitable programmable technologies.

Figure 2:
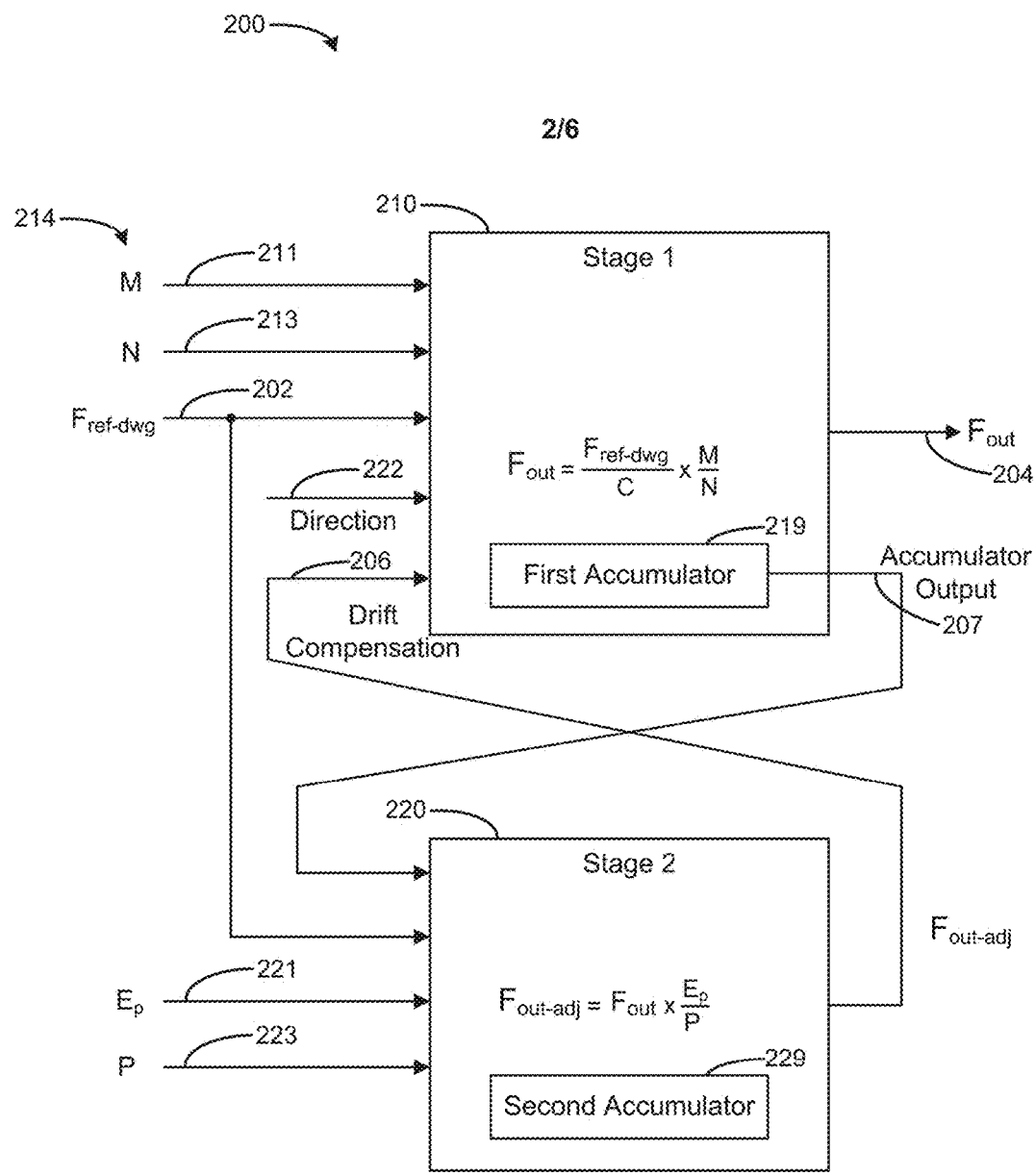
FIG. 2 is a block diagram of a device including a first stage and a first accumulator, and a second stage and a second accumulator, according to an example.

FIG. 2 is a block diagram of a device 200 including a first stage 210 and a first accumulator 219, and a second stage 220 and a second accumulator 229, according to an example. The first stage 210 is to scale a reference clock 202 by a configurable ratio of integers 214 (multiplier 211 and divider 213) according to a line drawing technique to obtain an output clock 204. The first stage 210 also receives, as input, a direction 222 and an output 206 of the second stage 220 (as drift compensation). The second stage 220 is to receive, as input, accumulator output 207 (from the first stage 210), the reference clock 202, an Ep input 221, and a P input 223. The second stage 220 is to provide as output Fout-adj, which can be used as input (e.g., for providing drift compensation) to the first stage 210.

The example device 200 is provided as two stages 210, 220. The first stage 210 is to provide base frequency generation, and the second stage 220 is to provide drift compensation for the first stage 210 (e.g., Fout-adj from the second stage 220 can be used to adjust the first accumulator 219 for drift compensation). Both stages 210, 220 can be based on their own line drawing technique, such as Bresenham's line drawing technique as explained above. The line drawing technique of a given stage can be used to approximate the slope of a line using integer arithmetic, e.g., according to the block diagram and associated description of FIG. 3. The accumulator 219 of the first stage 210 can be updated based on an input clock such as Fref-dwg 202, and the accumulator 229 of the second stage 220 can be updated based on using the accumulator output 207 of the first stage 210 as an enable.

The target output clock 204 frequency (Fout) is a conditioned output clock that incorporates drift compensation 206, and can toggle when the value of the first accumulator 219 becomes non-negative. In contrast to the accumulator output 207, the signal Fout 204 can incorporate drift compensation 206, such as by delaying or advancing pulses of Fout 204 based on the drift compensation 206. The accumulator output 207 can update every clock, but depending on whether drift compensation 206 is received from the second stage 220, the Fout 204 can either not update, or update, e.g., twice. Fout 204 can be expressed as a function of a reference clock (Fref-sys) and the multiplier (M) and divider (N) as Fout=Fref-sys*M/N. Because Fref-sys=Fref-dwg/C, substituting for Fref-sys yields Fout=Fref-dwg/C*M/N. The reference clock can be greater than or equal to twice the maximum output frequency. For example, reference clocks 102 and 202 can be implemented as a high-frequency clock derived from Fref-sys by a PLL multiplier, such as a main PLL of an SOC to create internal clocks used in devices. The line drawing technique does not need to extend into all eight octants, and may be defined for negative slopes whose absolute value is less than one. In this case, the input reference clock 202 of the digital waveform generator (Fref-dwg) is to be at least two times faster than the maximum target output frequency 204 (Fout) desired. Accordingly, it is possible that the reference clock of the digital waveform generator may, or may not, be the same as the reference clock used with an analog PLL to generate the high-tolerance output frequency. If different, then Fref-dwg is to be scaled by a constant C, so that M and N can be used as-is without needing modification to M and/or N. The direction input 222 received at the first stage 210 is to indicate whether to accelerate or delay pulses of the output clock 204, and can be based on the toggle of Fout-adj.

Because some of the example implementations, e.g., virtual PLLs, can operate based on using inputs that a standard PLL would receive, such example implementations can serve as a substitute for taking the place of a standard PLL, along with receiving such various inputs and providing outputs (e.g., drift compensation) as though it were a standard PLL. The example implementations can also serve as more complex standard PLL examples, such as those used in audio-visual (A/V) applications needing enhanced performance, such as performing fine drift compensation that would otherwise need complex analog circuits such as phase interpolators to achieve those benefits provided by the example implementations described herein. Under applicable usage scenarios, such as those with increased jitter tolerance (e.g., where an analog display is not physically connected), example implementations can be used to provide needed outputs. Accordingly, example implementations enable other available resources of a given system (e.g., an analog A/V PLL) to be freed up and devoted elsewhere while the example implementation serves as its substitute.

The second stage 220 is to perform error correction on the output clock 204 to account for clock frequency drift of the output clock 204. Generally, in an example implementation the second stage 220 is the absolute value of the clock drift as Ep 221 over time P 223, where Ep=abs(num_clocks_src− num_clocks_dest). The second accumulator 229 includes several bits (enough to store an accumulated error), and an upper bit of the second accumulator 229 is to toggle a number of times equal to Ep 221, during a period of a number of clocks equal to P 223, of the output of the first accumulator 219.

Thus, the device 200 can serve as a variable frequency oscillator with the first stage 210 providing frequency synthesis, and the second stage 220 adjusting the output clock 204 according to a ratio Ep/P based on an Ep input 221 and a P input 223. The Ep input 221 represents a number of waveform pulses to manipulate across a fixed period P. The various inputs, such as M, N, Ep, P, and direction, can be provided by a controller, transmitter, or other technique of passing inputs to the first and/or second stages 210, 220. In an example implementation, used in the context of Display-Port, a DisplayPort transmitter generates and provides to the first stage 210 Mvid and Nvid values, from which the integers 214 M and N (i.e., the multiplier and divider values of the reference clock) can be derived (Mvid and Nvid can be conditioned to provide to the first stage 210 the integers M and N). Example systems described herein can multiply Mvid and Nvid values by the appropriate ratio to obtain M and N, which are normalized to Fref-dwg.

The output clock 204 frequency is an integer ratio of the input reference frequency Fref-dwg, which is to be an integer multiple of Fref-sys, and also is to be at least twice the maximum output frequency (Fout-max). Fref-dwg is preferably as provided as high as is practical, in view of manufacturing choices and the silicon technology to be used to enable timing.

In summary, the output clock 204 (Fout) can be given by the following expressions and substitutions:

$$Fout=Fref\text{-}sys*M/N$$

$$Fref\text{-}dwg=Fref\text{-}sys*C \text{ where } Fref\text{-}dwg>=2*Fout\text{-}max$$

$$Fout=Fref\text{-}sys*C*M/(C*N)$$

$$Fout=Fref\text{-}dwg*M/(N*(Fref\text{-}dwg/Fref\text{-}sys))$$

The frequency of Fref-dwg can be chosen such that it is an integer multiple of Fref-sys. The ratio of the output frequency to the input frequency represents the slope of the line to be approximated: Fout/Fin=dy/dx=M/(C* N), where C=(Fref-dwg/Fref-sys).

A line drawing technique, such as Bresenham's line drawing technique, can be used in an X-Y coordinate system (see FIG. 4) to avoid a need to track potentially large Y values. Rather, the line drawing technique can be used to track a small error value between a lower and an upper bound, which represents the vertical distance between the calculated Y value and the actual Y value for a given value of X. As X increases, the error is increased by the slope, and when the error accumulation exceeds the upper bound, Y is decreased by 1 and the error is re-initialized according to the line drawing technique such that the accumulator is negative again.

Fref-sys can generally represent a common shared crystal input to, e.g., an SOC. Fref-sys can be multiplied up to form a plurality of internal clocks common to the SOC.

Figure 3:
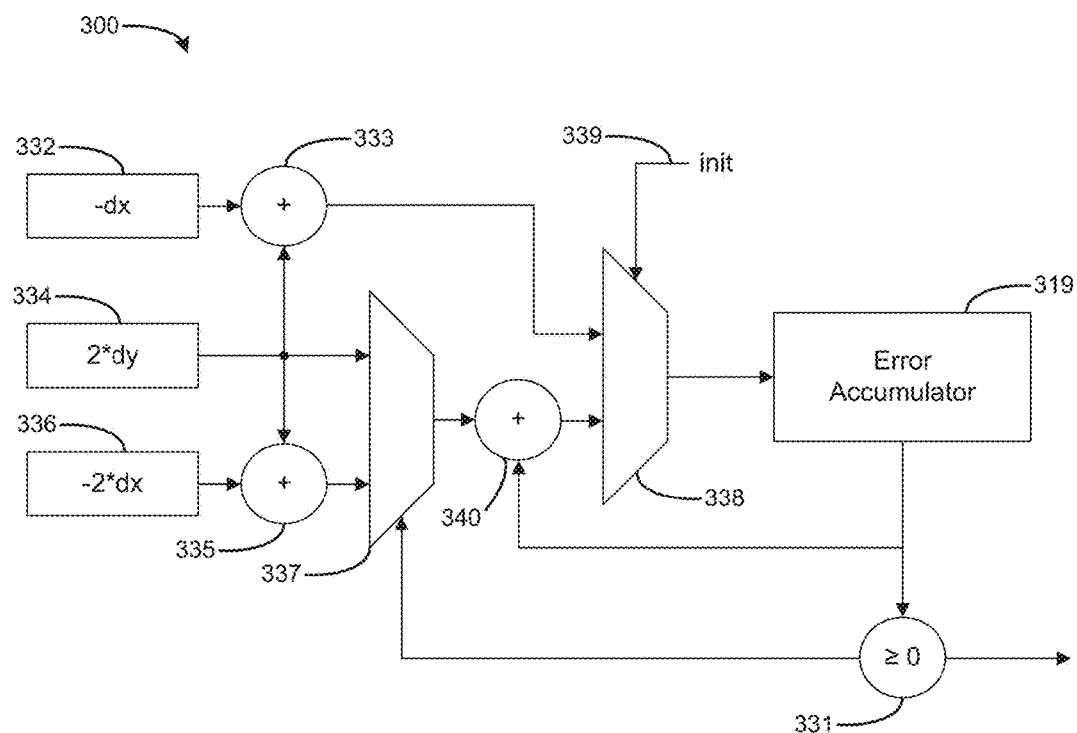
FIG. 3 is a block diagram of a device including inputs, multiplexers, and accumulator according to an example.

The first stage 210 and the second stage 220 can be based on similar components (e.g., components as shown in FIG. 3), whose inputs are used in different ways as described with reference to FIG. 2. The first stage 210 can use its inputs to provide raw frequency generation, to receive input parameters and generate an approximation of an expected output frequency. The second stage 220 can use its inputs to account for drift that may develop between the source crystal and the destination crystal, and compensate if they drift apart from each other. In the second stage 220, a line drawing technique is applied, but instead of using the inputs M 211 and N 213, the line drawing technique of the second stage 220 uses the Ep input 221 and the P input 223. Thus, the line drawing technique is used by the second stage 220 to essentially adjust over a period of the output clock 204 (the period being represented by the P input 223). A separate controller (not shown) can be used to drive the device 200 and provide the Ep input 221, the P input 223, and the direction 222. Alternatively, the controller can be integrated with device 200, such as being provided as another piece of logic on the same chip as device 200. The controller can receive user input for setting various inputs to the stage(s) 210, 220, and can provide inputs according to rules, dynamically and/or automatically. The input P 223 represents the period over which an adjustment/correction is to be made to the output clock 204 (Fout), and the input Ep 221 represents a number of times that the period, corresponding to input P 223, is to be adjusted/corrected. Thus, the line drawing technique used by the second stage 220 is to generate a line having a slope according to input Ep 221 and input P 223. The output of the second stage 220, Fout-adj, therefore represents a clock typically having a much lower frequency than Fout 204, which is a factor of the period designated by input P 223. The Fout-adj is then applied by the first stage 210 to provide a periodic adjustment to Fout 204 whenever Fout-adj toggles. Thus, the second stage 220 can be used to adjust the average output frequency of the output clock 204 either up or down slightly, to help account for clock frequency drift between the source device and the receiver.

Regarding operation of the second stage 220 more specifically, its adjustment logic can also use the Bresenham's line drawing technique and the same reference clock 202 (Fref-dwg) as the first stage 210 (e.g., using Fref-dwg as a clock for the stage 2 registers). The multiplier and divider used by the second stage 220 can be different from those used by the first stage 210, and represent the number of pulses to manipulate (input Ep 221) across a fixed period (input P 223). Thus, increasing input Ep 221 while holding input P 223 constant results in larger frequency adjustments to Fout 204. The output of the second stage 220 (Fout-adj) can be expressed as Fout-adj=Fout*Ep/P. Thus, Fout-adj can essentially create a version of Fout but selectively allowing just a sub-set of Fout clock pulses (i.e., Ep pulses) every fixed period (e.g., P is the total number of Fout pulses in the fixed period).

The second accumulator 229 of the second stage 220 can be used to store an error value. The upper bit of the second accumulator 229 will toggle Ep times during a period P of the output clock 204 Fout, and therefore can be used by the first stage 210 as a qualifier to determine whether the first stage 210 should accelerate Fout 204, resulting in an accelerated pulse(s) (to effectively speed up the average clock frequency of Fout), or delayed pulse(s) (to effectively slow down the average clock frequency of Fout).

The direction input 222 is used to indicate whether to accelerate or delay pulses, and can be provided by a controller (not shown) as referenced above regarding providing the Ep and P inputs 221, 223. When delaying pulse(s), the next expected pulse is delayed after the output qualifier from the second stage 220 is asserted. When accelerating pulse(s), care is taken by the corresponding stage(s) such that the new pulse does not occur in the same cycle or adjacent cycle as an existing pulse, and the new pulse occurs far enough away from an existing pulse such that the timing constraint on Fout (where Fref-dwg>=2*Fout-max) is not violated. For this reason, the Fref-sys scaling constant C is to be large enough such that there is enough margin between pulses generated by the first stage 210 base frequency generation to allow a pulse to be accelerated while ensuring that consecutive pulses of Fout do not violate duty cycle parameters (e.g., without creating a cycle-to-cycle output frequency that exceeds Fout-max).

There are situations/applications where the first stage 210 can be used alone (e.g., as device 100 shown in FIG. 1). For some lower constraint applications a virtual/placebo clock is sufficient, and for other applications (such as DisplayPort) the clock is needed to be accurate overtime. The example output clocks can be generated by various example implementations to include high jitter, with a difference being the number of pulses accumulated over time. Unlike applications such as DisplayPort receivers, which have higher constraints on acceptable quality of output clocks, applications such as multi-host environments have lower constraints and can function without the drift compensation that the second stage 220 provides. For example, in a multi-host environment where a given host is not actively displaying, or the host is redirecting video over the network and/or distributing out multiple feeds of video to hosts operating at different screen resolutions, the high quality drift compensation provided by the second stage 220 is not needed, because the base frequency synthesis provided by the first stage 210 is sufficient for such purposes. Accordingly, such systems can be driven by the first stage 210 of the device 200, without needing the second stage 220 or other clock sources (such as large analog PLLs). Such systems therefore can be more compact and efficient by implementing devices based on the first stage 210 alone, and/or the second stage 220.

Generally, the first stage 210 provides a linear approximation by multiplying and/or dividing from the base frequency of the reference clock 202 to obtain an output frequency of the output clock 204. The second stage 220 is to provide smaller-scale variations relative to the base frequency of the first stage 210, enabling finer adjustments. For example, as a DisplayPort receiver, device 200 can obtain information relating to how many clocks have expired within a certain amount of time. In order to match the desired DisplayPort frequency (to compensate for any errors that are occurring over time as the device 200 measures the remote frequency of the received signal with respect to the generated internal frequency), the device 200 can identify that, over time, it will receive Ep events in P amount of time, corresponding to a given number of pixels over a time period. If the number of pixels differs by 1 or 2 pixels, the device 200 can perform, via the second stage 220, a miniscule adjustment as a feedback mechanism for fine-grain control. For example, over the period of 24 or 48 clocks, the second stage 220 can accelerate or delay clocks to change the total clocks by one Fref-dwg clock. Thus, the second stage 220 can operate using the same principles (e.g., line drawing technique) as the first stage 210, but at a finer scale. Accordingly, the output of the first stage 210 will oscillate at a much higher rate than will the output of the second stage 220. In the DisplayPort example, the P input 223 can serve as an approximation of the width of a video line, and the Ep input 221 can serve as the number of adjustments per that video line that are to be applied. A FIFO can be used to count the number of incoming pixels with respect to Fout's ability to remove them, where the difference is Ep.

The device 200 can operate without using complex operations or variables such as floating point arithmetic with double precision. Rather, the device 200 can obtain accurate results using digital logic and integer arithmetic (e.g., using adders and subtractors), by observing attributes of the remote frequency and compensating for them.

FIG. 3 is a block diagram of a device 300 including input values 332, 334, 336, multiplexers 337, 338, and an accumulator 319 according to an example. The device 300 is an example implementation illustrating lower level details implementing digital logic and integer arithmetic, which can serve as the first and/or second stages 110, 210, 220 of FIGS. 1 and 2. The device 300 can implement a line drawing technique, and instead of evaluating the line function at the midpoints of lines, the difference between points can be evaluated allowing for use of integer arithmetic as shown and described below.

The −dx value 332 is fed into a first adder 333, which is added with the 2*dy value 334, which is also fed into the first adder 333. The result from the first adder 333 (2*dy−dx) is provided to the second multiplexer (MUX) 338. The second MUX 338 is controlled by the initialize signal 339. The second adder 335 receives as input the −2*dx value 336 and the 2*dy value 334, and feeds the result (2*dy−2*dx) from the second adder 335 to the first MUX 337. The first MUX 337 also receives the 2*dy value 334. The first MUX 337 is controlled by output from comparator 331. Output from the first MUX 337 is fed to adder 340, which also receives output from error accumulator 319. Output from the adder 340 is fed to the second MUX 338. Output of the second MUX 338 is fed to the accumulator 319. The comparator 331 checks whether the accumulator 319 is storing a value greater than or equal to zero, which controls which value the first MUX 337 passes to the adder 340.

Output from the first adder 333 represents an initialization term, p(0)=2*dy−dx, which is loaded during reset into the error accumulator 319 via the second MUX 338 and selection by initialize signal 339. Output from the second adder 335 is the value 2*dy−2*dx, which serves as the lower input to the first MUX 337, and which is selected when p(k)>=0. The upper input to the first MUX 337 is the value 2*dy, which is selected when p(k)<0. Output from the first mux 337 is added with output from the error accumulator 319 at adder 340, which represents (depending on which MUX input is selected) p(k+1)=p(k)+(2*dy−2*dx) or p(k+1)=p(k)+2*dy.

The following expressions illustrate a technique for evaluating p(0), p(k), and p(k+1), based on the values of integers M and N (as referenced in the context of integers 114, 214 with reference to FIGS. 1 and 2) and selectively adjusting the value of M (where the symbol << represents a left shift of the bits of M by the value 1). As described above, the integers M and N are derived by scaling/normalizing, if needed, Mvid and Nvid values obtained from a symbol rate link clock transmitted as data in a DisplayPort link, in order to compensate as appropriate for the ratio between the symbol rate clock of the DisplayPort transport, and the reference clock of the example system. For example, if M is a 4-bit value, then M<<1 represents concatenating a zero as the fifth bit (least significant bit (LSB)) onto the previous 4-bit value, creating a 5-bit value having the previous 4-bit value and a zero in its LSB. The value p(0) represents an initial starting value used in the line drawing technique, p(k) represents a current value of the line based on current differences in X and Y coordinates of the line, p(k+1) represents the next value of the line based on the differences in X and Y coordinates of the line, and the constant C represents (Fref-dwg/Fref-sys), as follows:

$$p(0)=2*dy-dx=(M<<1)-(C*N)$$

if p(k)<0 then $$p(k+1)=p(k)+(2*dy)=p(k)+(M<<1)$$

else $$p(k+1)=p(k)+(2*dy)-(2*dx)=p(k)+(M<<1)-((C*N)<<1)$$

The above statements are one example implementation, and other implementations can be used (e.g., using a "case" statement instead of the "if, then, else" statement as shown, and so forth). The constant C can be used to multiply the N value, to compensate for clock speeds. Such example expressions can be used to adjust the output clock Fout 204, e.g., by advancing or delaying Fout 204. For example, in response to the first stage 210 receiving drift compensation 206 from the second stage 220, the first stage 201 can evaluate the (if, then, else) expressions twice to advance Fout 204, or can skip evaluating the (if, then, else) expressions to delay Fout 204. For example, when drift compensation corresponds to advancing/boosting Fout 204 the next value p(k+1) will be advanced by twice adding (2*dy), i.e., by adding (4*dy). In response to the first stage 210 receiving drift compensation 206 indicating the delay condition, the first stage 201 can update p(k) without adding anything. Thus, the approach set forth in the above equations can be iterated multiple times as needed, using additional iterations to advance (and skipping iteration(s) to delay) the output clock Fout 204 to accomplish, e.g., drift compensation.

In some example implementations, at least one look-ahead accumulator can be used. The look-ahead accumulator(s) can be expressed as, e.g., a first look-ahead accumulator to evaluate p(k+1), a second look-ahead accumulator to evaluate p(k+2), etc. Accordingly, if the drift compensation indicates advancing, the first stage 210 can transition from the base accumulator (representing p(k)) to the second look-ahead accumulator p(k+2) (instead of the first look-ahead accumulator p(k+1)). A look-ahead accumulator also can be used to avoid causing overlap of pulses of the output clock. For example, the device 200 can monitor a look-ahead accumulator to determine whether there will be accelerated pulses in the output clock, and whether a pulse would be too close to the current time, and the device can then avoid accelerating pulses at that time in the output clock. Similarly, the device 200 can use a look-ahead accumulator to evaluate whether to delay a clock, e.g., if a clock already is present and the look-ahead accumulator shows another will occur too close to the already-present clock.

The sizes of registers to hold values such as M and N are chosen large enough to accommodate the bit shift. The device 300 can be realized using a register and/or accumulator to compute the accumulated error as a signed 2's complement integer stored in the accumulator 319. The accumulator would be chosen wide enough to support the larger of (M<<1) or ((C*N)<<1).

As illustrated by the first equation above, the accumulator is initialized to p(0). As illustrated by the next two equations, the accumulator will be incremented by 2*dy until going positive, allowing the upper bit of the accumulator to be used as the output clock waveform. The p(k) value represents the accumulated error. The upper bit can also be used to invert the current value of the output waveform if a more evenly distributed duty cycle is desired. Each time the line drawing technique moves down the represented line in the X direction, the error is accumulated in p(k), representing the error term. The resulting waveform is not guaranteed to have a symmetric duty cycle or even be periodic cycle-by-cycle for every combination of M and N, but will closely approximate the target output frequency when averaged over time.

Figure 4:
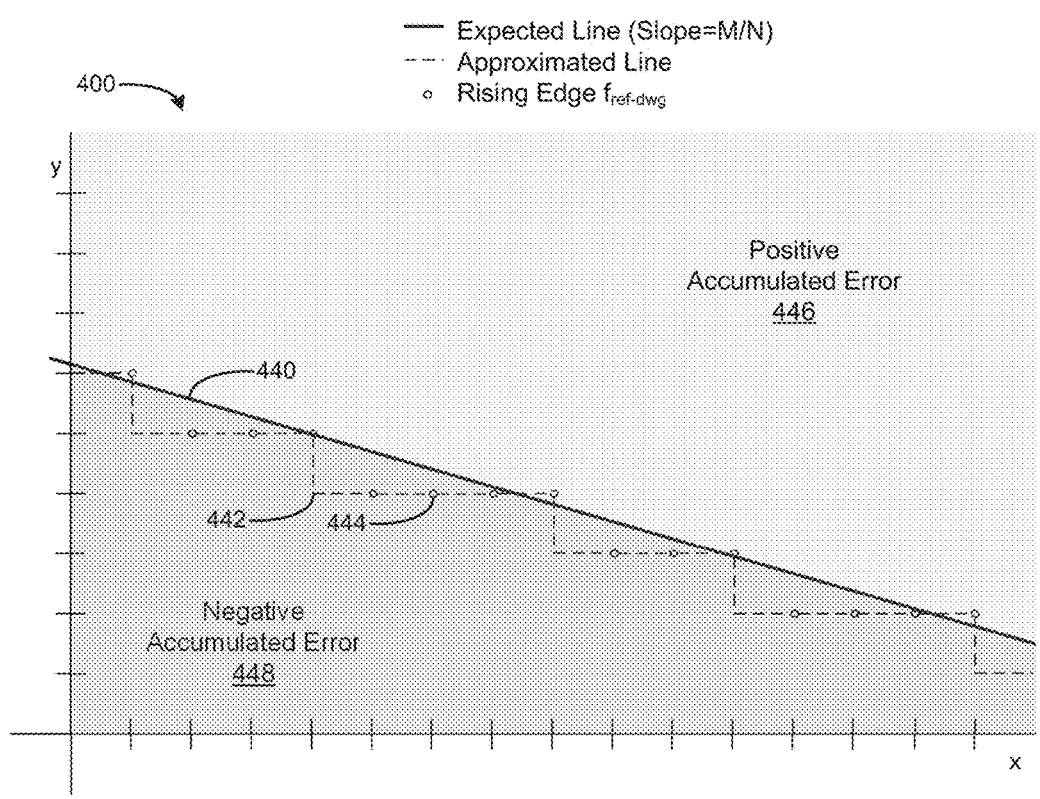
FIG. 4 is a chart including an expected line having a slope based on a configurable ratio of integers, and an approximated line based on a line drawing technique according to an example.

The line drawing technique causes p(0) to start on the approximated line (see FIG. 4), and p(0) is not always going to be zero, and instead will be some negative value, but will start as near as practical to the original/expected line, and with successive values will move in the X direction (to the right as shown in FIG. 4) until that negative value turns positive, at which time an overflow occurs and the value goes in the Y direction (downward as shown in FIG. 4).

FIG. 4 is a chart 400 including an expected line 440 having a slope based on a configurable ratio of integers, and an approximated line 442 based on a line drawing technique according to an example. The approximated line 442 also is based on a plurality of rising edges 444 (corresponding to a leading edge of a pulse of a clock signal). Positive accumulated error 446 is shown above the expected line 440, and negative accumulated error 448 is shown below the expected line 440. The expected line 440 is approximated based on non-negative error accumulation being used to generate the new clock. Error is illustrated as deviation of the approximated line 442 away from the ideal of the expected line 440. If moving in the X direction along the approximated line 442, every time the error accumulator overflows, the approximated line 442 moves down along the Y direction, thereby approximating the slope of the expected line 440. The illustrated example provides a negative slope, by scaling the Fref-dwg down, thereby sloping downward and to the right in FIG. 4.

Figure 5:
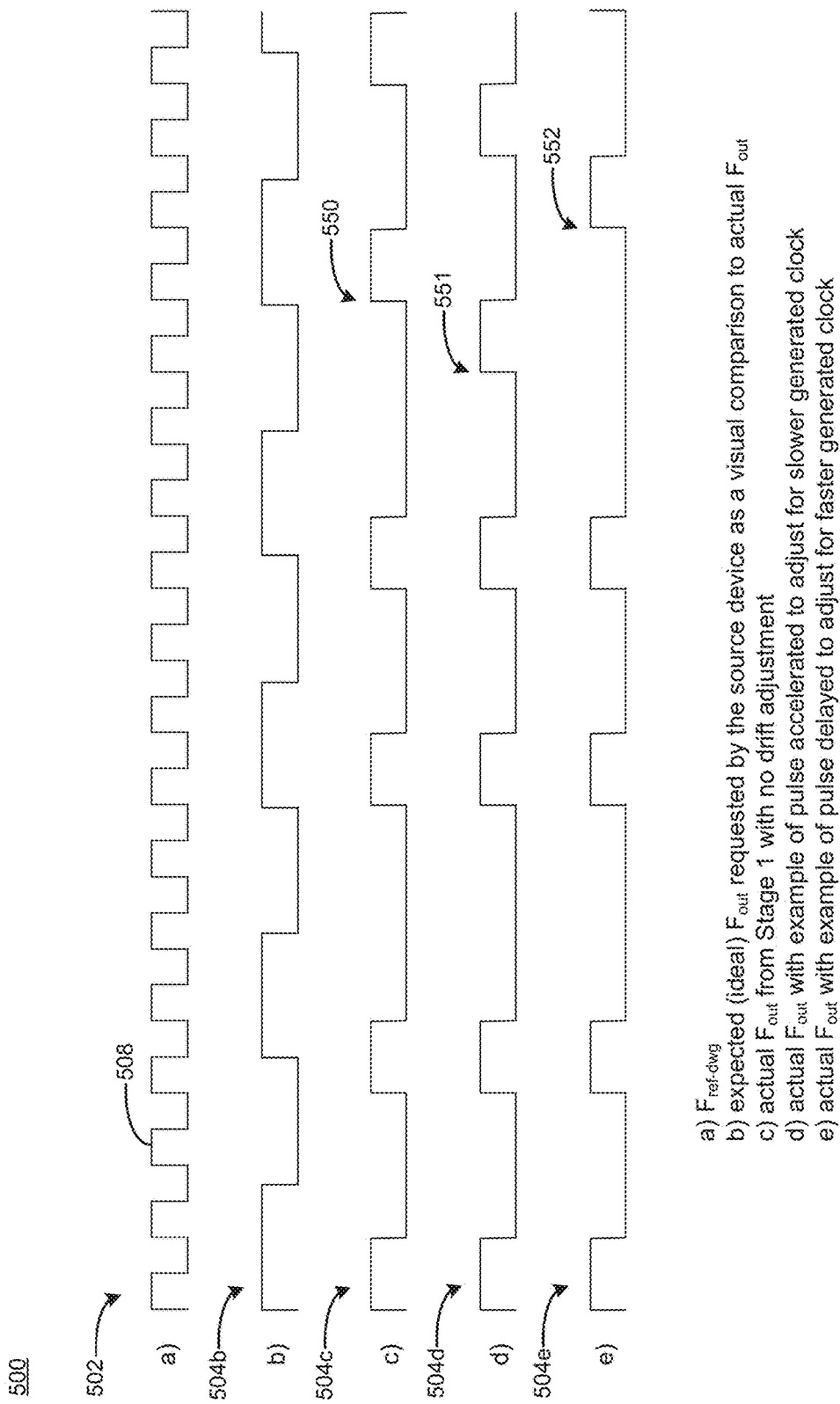
FIG. 5 is a chart including a reference clock and a plurality of output clocks according to an example.

FIG. 5 is a chart 500 including a reference clock 502 and a plurality of output clocks 504b, 504c, 504d, and 504e according to an example. A given clock, such as reference clock Fref-dwg 502, includes a plurality of pulses 508, which are associated with at least one edge (a rising/leading edge, and falling/trailing edge, are shown for most illustrated pulses, except the last pulses of reference clock 502 and output clocks 504b and 504e, which show leading edges of the last pulse). The output clock 504b represents an expected (ideal) output clock Fout, which would be requested by a source device, and is provided as a visual comparison to actual output clocks that can be generated by examples described herein. The output clock 504c represents an actual output clock from an example first stage (e.g., first stage 210 of FIG. 2), without drift adjustment. Output clock 504c includes unadjusted pulse 550.

The output clock 504d represents an actual output clock that has been accelerated to adjust for a slower generated clock. Output clock 504d includes accelerated pulse 551, shown shifted to the left, relative to unadjusted pulse 550, by one clock cycle of reference clock 502. Subsequent pulses of output clock 504d, following the accelerated pulse 551, have been shifted to the left along with the accelerated pulse 551. Such a situation can be generated by a device's accumulator (such as first accumulator 219 of FIG. 2) being caused to overflow sooner by drift compensation 206, and then preloading the next value such that the accumulator will overflow at the expected time subsequently (as shown by the subsequent pulses in that output clock 504d).

The output clock 504e represents an actual output clock that has been delayed to adjust for a faster generated clock.

Output clock 504e includes delayed pulse 552, shown shifted to the right, relative to unadjusted pulse 550, by one clock cycle of reference clock 502. Subsequent pulses of output clock 504e, following the delayed pulse 552, have been shifted to the right along with the delayed pulse 552. Such a situation can be generated by a device's accumulator (such as first accumulator 219 of FIG. 2) being caused to overflow later by drift compensation 206, and then preloading the next value such that the accumulator will overflow at the expected time subsequently (as shown by the subsequent pulses in that output clock 504e).

The reference clock 502, and the output clock 504b, illustrate examples of square waves having 50-50 duty cycles, in contrast to output clocks 504c, 504d, and 504e having a pulse associated with each rising edge, with longer gaps between the pulses, resulting in less than a 50-50 duty cycle. It is possible to adjust the duty cycle by performing an additional divide by 2, e.g., by flipping the current value whenever the accumulator is positive, and also by doubling the M value.

Some example output waveforms, such as output clocks 504d and 504e, are not symmetric and/or periodic. This can arise from example devices, e.g., as a result of the Brezenham line drawing technique not producing a repeating pattern, being affected by stage two injection, and jitter arising in cases where (2*dy) is not an integer multiple of (2*dy−2*dx).

Figure 6:
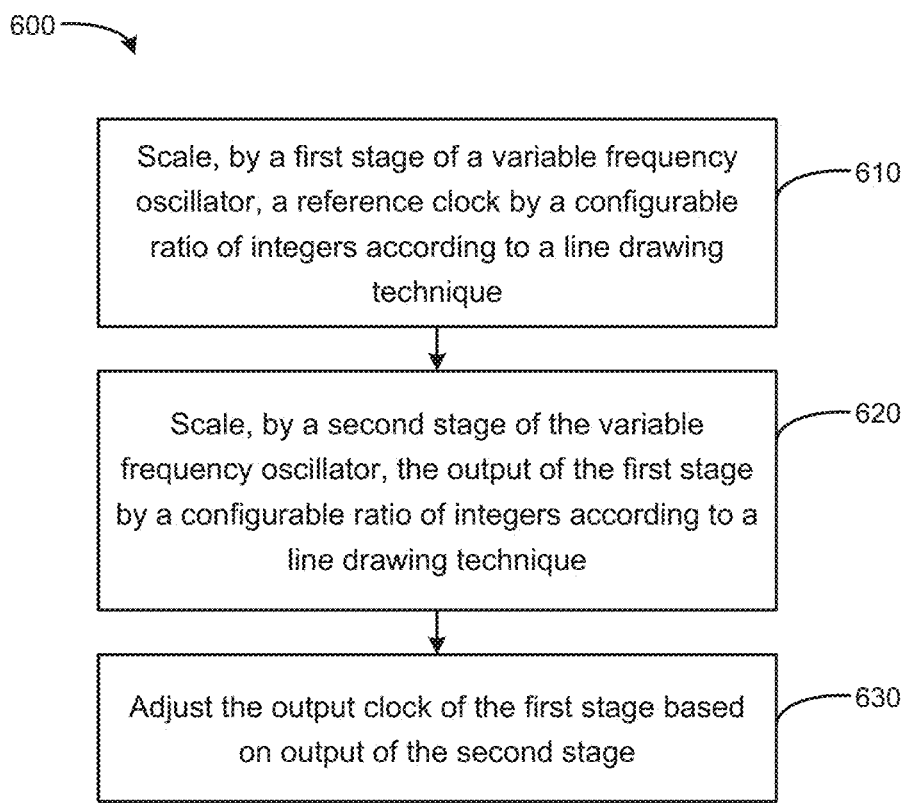
FIG. 6 is a flow chart based on adjusting an output clock according to an example.

Referring to FIG. 6, a flow diagram is illustrated in accordance with various examples of the present disclosure. The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 6 is a flow chart 600 based on adjusting an output clock according to an example. In block 610, a first stage of a variable frequency oscillator is to scale a reference clock by a configurable ratio of integers according to a line drawing technique. For example, the first stage is to derive, from DisplayPort Mvid and Nvid values, a multiplier M and divider N as the ratio of integers.

In block 620, a second stage of a variable frequency oscillator is to scale accumulator output of the first stage by a configurable ratio of integers according to the line drawing technique. For example, the second stage can adjust the accumulator output of the first stage according to a ratio Ep/P based on Ep and P inputs, and by accumulating an error in a second accumulator, to determine whether to accelerate or delay pulses to the output clock for drift compensation, to effectively speed up or slow down the average clock frequency of the output clock.

In block 630, the output clock of the first stage is adjusted based on output of the second stage. For example, the first stage is to provide base frequency synthesis according to Bresenham's line drawing technique by applying digital logic and integer arithmetic. The first accumulator is to accumulate errors, and when the first accumulator overflows, the first stage is to generate a pulse at a frequency corresponding to the base output clock frequency. Drift compensation of the first accumulator is adjusted by using Fout-adj of the second stage, which is a version of Fout having a sub-set of Fout clock pulses (Ep pulses) every fixed period (P is the total number of Fout pulses in the fixed period).

What is claimed is:

1. A device comprising:
    a first stage based on digital logic and integer arithmetic to scale a reference clock by a configurable ratio of integers according to a line drawing technique to obtain an output clock; and
    an accumulator to store an accumulated error of a variable used in the line drawing technique, to adjust the output clock.

2. The device of claim 1, wherein the accumulator is to store the accumulated error as a signed two's complement integer.

3. The device of claim 1, wherein the first stage is to generate a pulse of the output clock in response to an overflow of the accumulator.

4. The device of claim 1, wherein the configurable ratio of integers is expressed in terms of multiplier (M) and divider (N) as M/N, and is expressible at a finer granularity than a binary divisor.

5. The device of claim 4, wherein the first stage is to apply a scaling constant C to configure the configurable ratio of integers M/N.

6. The device of claim 1, further comprising a second stage to provide drift compensation to adjust the output clock, to account for clock frequency drift of the output clock.

7. The device of claim 6, wherein the device is to serve as a substitute phase lock loop (PLL) to receive at least one input modeled from a standard PLL, and to provide at least one output modeled from the standard PLL.

8. The device of claim 1, wherein the digital logic and integer arithmetic are to scale the reference clock according to Bresenham's line drawing technique.

9. A variable frequency oscillator comprising:
    a first stage to scale a reference clock by a configurable ratio of integers according to a line drawing technique, and to adjust the output clock based on a first accumulator to store an accumulated error of a variable used in the line drawing technique to adjust the output clock; and
    a second stage based on digital logic and integer arithmetic to provide drift compensation to adjust the output clock according to the line drawing technique to compensate for clock frequency drift between the reference clock and the output clock.

10. The variable frequency oscillator of claim 9, wherein the second stage of the variable frequency oscillator is to adjust the output clock according to a ratio Ep/P based on an Ep input and a P input, and wherein Ep represents a number of waveform pulses to manipulate across a fixed period P.

11. The variable frequency oscillator of claim 10, wherein the second stage includes a second accumulator, and wherein an upper bit of the second accumulator is to toggle Ep times during a period of P clocks of the reference clock.

12. The variable frequency oscillator of claim 9, wherein the first stage is to receive a direction input indicating whether to accelerate or delay pulses of the output clock.

13. The variable frequency oscillator of claim 12, wherein the configurable ratio of integers is to be scaled by a constant C to create a margin between pulses of the output clock to allow the output clock to be accelerated without creating a cycle-to-cycle output frequency that exceeds a maximum frequency.

14. A method, comprising:
    scaling, by a first stage of a variable frequency oscillator, a reference clock by a configurable ratio of integers according to a line drawing technique;

scaling, by a second stage of the variable frequency oscillator, accumulator output of the first stage by a configurable ratio of integers according to a line drawing technique; and adjusting the output clock of the first stage based on output of the second stage.

15. The method of claim 14, further comprising scaling the configurable ratio of integers by a constant C to create a margin between pulses of the output clock to allow the output clock to be accelerated without creating a cycle-to-cycle output frequency that exceeds a maximum frequency.

* * * * *